(12) United States Patent
Yeckel et al.

(10) Patent No.: US 10,855,262 B2
(45) Date of Patent: Dec. 1, 2020

(54) SYSTEMS AND METHOD FOR PARALLELED IDENTICAL MARX GENERATORS

(71) Applicant: Stangenes Industries, Inc., Palo Alto, CA (US)

(72) Inventors: Christopher Yeckel, Palo Alto, CA (US); Kelli Noel, Palo Alto, CA (US); Magne Stangenes, Palo Alto, CA (US); Paul Holen, Palo Alto, CA (US); Randy Ross, Palo Alto, CA (US); Richard Cassel, Palo Alto, CA (US); Sherry Hitchcock, Palo Alto, CA (US)

(73) Assignee: Stangenes Industries, Inc., Palo Alto, CA (US)

( * ) Notice: Subject to any disclaimer, the term of this patent is extended or adjusted under 35 U.S.C. 154(b) by 179 days.

(21) Appl. No.: 16/011,955

(22) Filed: Jun. 19, 2018

(65) Prior Publication Data
US 2018/0367125 A1    Dec. 20, 2018

Related U.S. Application Data

(60) Provisional application No. 62/521,819, filed on Jun. 19, 2017.

(51) Int. Cl.
*H02M 1/16* (2006.01)
*H03K 3/57* (2006.01)
*H03K 3/537* (2006.01)

(52) U.S. Cl.
CPC ............. *H03K 3/537* (2013.01); *H02M 1/16* (2013.01); *H03K 3/57* (2013.01)

(58) Field of Classification Search
CPC ............ H03K 3/537; H03K 3/57; H02M 1/16
(Continued)

(56) References Cited

U.S. PATENT DOCUMENTS

| 2006/0245217 A1 | 11/2006 | Kirbie et al. |
| 2007/0139090 A1 | 6/2007 | Cassel |
| 2012/0193992 A1* | 8/2012 | Heuermann ....... G01R 33/3852 307/84 |

FOREIGN PATENT DOCUMENTS

WO    2011/146498 A2    11/2011

OTHER PUBLICATIONS

International Search Report and Written Opinion dated Oct. 16, 2018, directed to International Application No. PCT/US2018/038304; 15 pages.

* cited by examiner

*Primary Examiner* — Hal Kaplan
(74) *Attorney, Agent, or Firm* — Davis Wright Tremaine LLP

(57) ABSTRACT

A parallel Marx generator topology capable of producing high power, high current output pulses is provided. The parallel Marx generator topology can include a plurality of Marx generators that operate in parallel to one another to jointly generate an output pulse. The topology can further include a pulse transformer configured to step up the voltage of the pulse created by the plurality of generators and also ensure that each Marx generator of the plurality of Marx generators is outputting substantially the same amount of current. The system can include a common interface that allows for fault detection and control of all the Marx generators using one common control panel. The parallel Marx generator topology can allow for a high voltage, high current pulse to be generated using import/export compliant switches.

14 Claims, 14 Drawing Sheets

(58) Field of Classification Search
USPC .................................................. 307/106, 108
See application file for complete search history.

SYSTEMS AND METHOD FOR PARALLELED IDENTICAL MARX GENERATORS

REFERENCE TO RELATED APPLICATIONS

This application claims the benefit of U.S. Provisional Application No. 62/521,819, entitled, "SYSTEMS AND METHOD FOR PARALLELED IDENTICAL MARX GENERATORS," filed Jun. 19, 2017, the entire contents of which are incorporated herein by reference.

FIELD OF THE INVENTION

The present disclosure relates to systems and methods for generating high voltage pulses. More particularly, the present disclosure relates to systems and methods for generating high voltage pulses controlled by solid state switches.

BACKGROUND OF THE INVENTION

Many applications need a pulsed power supply that is able to deliver high voltage pulses. Spectrometers, klystrons, accelerators, radar transmitters, high impedance electron guns, ion tubes, liquid polarizing cells, etc., are examples of applications that need high voltage pulses. In conventional systems, a pulsed power supply uses a high voltage pulse forming network and some sort of switch such as a spark gap or a thyratron.

These types of pulsed power supplies are often created using principles of Marx Generators. Generally, a Marx Generator is circuitry that generates a voltage pulse by charging a group of capacitors in parallel and then discharging the capacitors in series. FIG. 1 illustrates an example of a typical Marx Generator. In FIG. 1, a charging voltage 101 is applied to a pulse forming network 100. The stage capacitors 104 charge through the resistors 102 in a parallel fashion. The spark gaps 106 prevent the capacitors 104 from discharging into a load 108 until certain conditions are satisfied.

Because a Marx Generator is charged in parallel, the magnitude of the voltage pulse can be increased by adding additional charging sections. However, it has been found that the number of sections that can be stacked together is effectively limited by stray capacitance. As the number of sections in the pulse forming network increases, the stray capacitance to ground can increase. Stray capacitance can cause parasitic current to be diverted to ground which can have an adverse effect on the rise time and/or fall times of the voltage pulse. The stray capacitance therefore limits the number of sections that can be included in the pulse generator.

The stray capacitance can also have an impact on the voltage that a particular section sees. In addition, the stray capacitance seen by one section is usually different from the stray capacitance seen by another section of the Marx Generator. Because the stray capacitance is not balanced across the sections of the pulse generator, some of the sections may experience higher voltage transients and may therefore malfunction. Although all Marx generator systems are affected by stray capacitance, the inductors, resistors, transformers, and isolated supplies needed to charge the capacitors in the pulse generator also add stray capacitance to the pulse generator. In other words, the components of conventional pulse generators introduce additional stray capacitance to the system and further reduce the number of stages that can be successfully connected together.

In some scenarios, the power of the pulse required to be outputted by the Marx generator maybe substantial enough to require the use technology that may not be compliant with various export and import regulations, thus making the generator commercially infeasible.

SUMMARY OF THE INVENTION

These and other limitations are overcome by embodiments of the present disclosure, which relates to systems and methods for generating a voltage pulse. In one embodiment of the disclosure, a series voltage cells with relatively low voltage requirements can be stacked together in series, each voltage cell including a capacitor connected in series with a switch (such as a solid state switch) that can be turned on and off. When multiple voltage cells are connected to form a pulse generator, the capacitors of the voltage cells are charged in parallel and discharged in series using one or more switches. Main switches are used at least to discharge the capacitors and return switches are used at least to charge the capacitors.

When the voltage cells are stacked, for example, the capacitors and main switches are connected in series. The capacitors are isolated from each other by the main switches which are turned off. When the main switches are on, the capacitors are connected in series and a voltage pulse is generated. When the main switches are off, the return switches may be turned on and provide a return path for the current that charges the capacitors in the voltage cells. Thus, the return switches are off when the main switches are on such that the capacitors discharge to the load. Advantageously, the capacitors can be charged without the use of inductors, resistors, or isolated supplies, thereby reducing some of the stray capacitance associated with conventional Marx Generators. In addition, the switches can be driven by use of an auxiliary supply without using inductors, resistors, isolated supplies, or step down supplies.

The capacitors in each voltage cell can be charged through a diode string supply line. A return path for the charging current is provided through return switches. When the capacitors are charging or are charged, main switches placed between successive capacitors are in an off state and prevent the capacitors from discharging in series. When the main switches are turned on, the capacitors are then connected in series and discharge. During discharge, the return switches are turned off. To recharge the capacitors, the main switches are turned off and the return switches are turned back on. The return switches can also be turned on during discharge to help, in one embodiment, decrease the fall time of the pulse by providing a path for the stray capacitance to discharge.

The voltage cells can also be configured to generate either a positive or a negative voltage pulse. In one embodiment, a bipolar pulse generator has a capacitor bank that includes a series of voltage cells configured to generate a positive pulse can be connected with a capacitor bank that includes a series of voltage cells configured to generate a negative pulse. This bipolar pulse generator can charge all of the capacitors in both sets of voltage cells at the same time. The switches in the respective capacitor banks can be controlled to discharge one set of capacitors to generate either the positive or the negative pulse. In addition, voltage cells that are configured to charge in series can be added to provide droop control and control the shape of the generated voltage pulse.

Each voltage cell may also include a balance network that balances the stray capacitance seen by that voltage cell.

Because each voltage cell in a series of voltage cells "sees" a different stray capacitance, the balance networks can be adapted to match the stray capacitance seen by the voltage cells. This has the benefit of balancing the voltage transients seen by each cell.

The voltage cells can be used to adjust the voltage pulse by controlling which voltage cells are active. In other words, one or more of the voltage cells can be made inactive to alter the voltage pulse without affecting the ability to generate the voltage pulse. At the same time, the failure of a particular cell does not prevent the pulse generator from pulsing. Thus, embodiments of the present disclosure can control the amplitude of the voltage pulse, a duration or width of the voltage pulse, the rise and fall times of the voltage pulse, and the like or any combination thereof.

In one embodiment of a pulse generator, some of the voltage cells can further be configured to include a ringing circuit that can be used to provide droop correction. The circuit can provide droop compensation or droop correction to the output of the pulse generator such that the droop correction is smooth rather than jagged or saw-toothed. The ringing circuit includes capacitors that charge in series and then discharge in parallel to a ringing capacitor, which is able to discharge in a manner to provide smooth droop compensation or correction.

In another embodiment of the disclosure, the voltage cells provide isolation protection. For example, if a particular voltage cell fails, then that cell can be isolated without impacting the ability of the pulse generator to generate and deliver a pulse to a load. Each voltage cell typically includes a diode across the return switch. If the main switch is off, then the discharge current can flow through this diode and the cell is effectively isolated.

In another embodiment of the disclosure, a parallel Marx topology can be employed to generate high-powered pulses, wherein the system can include a plurality of Marx generators that are configured to work in parallel to collectively generate a high-energy pulse. In this way, each Marx generator can continue to employ commercial off the shelf switch and capacitor technology that is export/import regulations compliant.

Additional features and advantages of the disclosure will be set forth in the description which follows, and in part will be obvious from the description, or may be learned by the practice of the disclosure. The features and advantages of the disclosure may be realized and obtained by means of the instruments and combinations particularly pointed out in the appended claims. These and other features of the present disclosure will become more fully apparent from the following description and appended claims, or may be learned by the practice of the disclosure as set forth hereinafter.

DETAILED DESCRIPTION OF THE INVENTION

The present disclosure relates to systems and methods for generating a voltage pulse. Embodiments of the disclosure can control an amplitude of the voltage pulse, a duration or width of the voltage pulse, a rise time of the voltage pulse, a fall time of the voltage pulse, and the like or any combination thereof. Some embodiments of the disclosure can generate and deliver a voltage pulse without the use of transformers.

Embodiments of the disclosure include voltage cells that typically have both a capacitor and a switch in series. The first and last voltage cells in a series of voltage cells may be adapted to connect to the load. Return switches are also included in most voltage cells. The return switches provide a path for the charging current supplied through a diode chain or a diode chain supply line. Advantageously, the return switches eliminate the use of inductors, resistors, and isolated supplies prevalent in conventional pulse generators. The switch drives may also be provided with energy through an auxiliary diode chain, thereby eliminating the need for inductors, resistors, isolated supplies, and step down supplies that would otherwise be needed to provide the auxiliary power to the switch drives. Also, the elimination of these components reduces the stray capacitance to ground associated with the systems and methods described herein, which enables more voltage cells or sections to be stacked in series.

Figure 1:
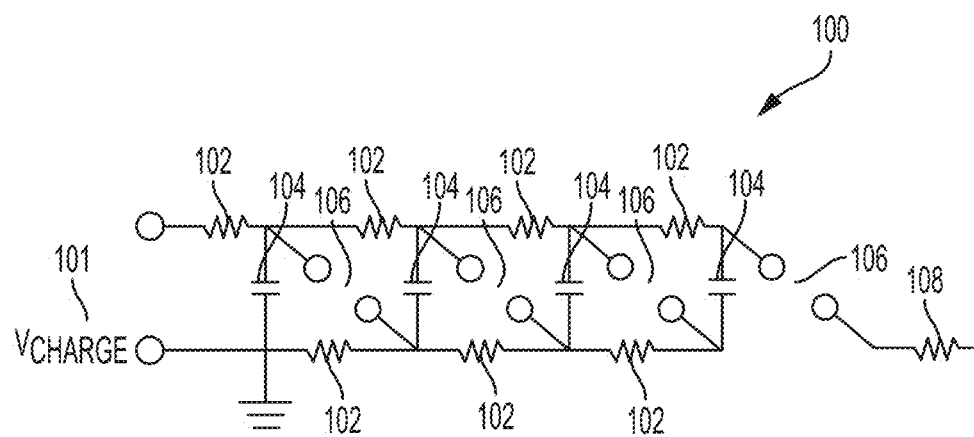
FIG. 1 illustrates an example of a Marx Generator that uses spark gaps to generate a voltage pulse.
Figure 2:
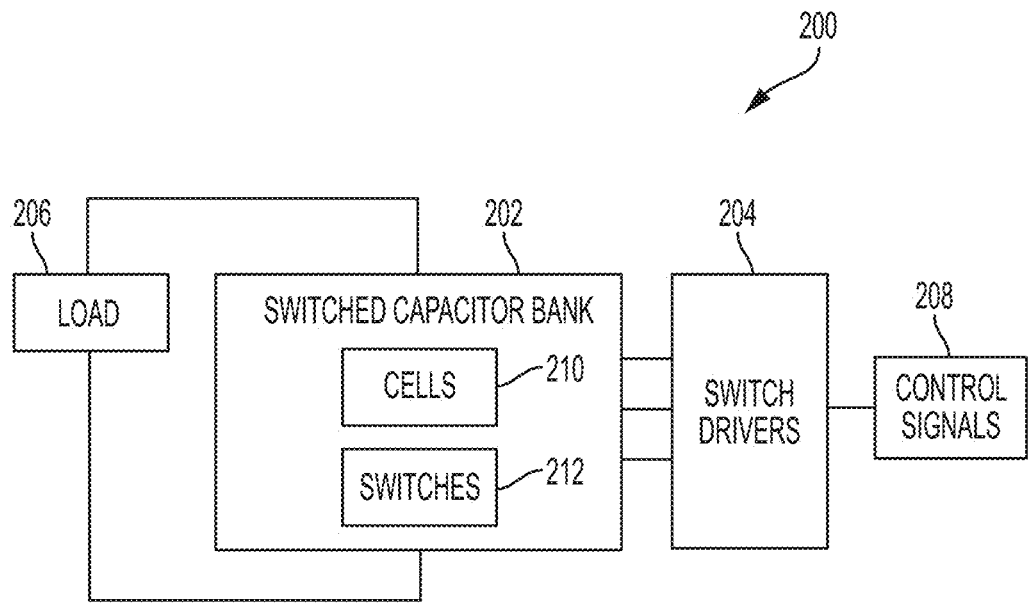
FIG. 2 illustrates one embodiment of a pulse generator that uses switches to control a series of voltage cells.

FIG. 2 illustrates a block diagram of one embodiment of a pulse generator or system for generating and delivering a high voltage pulse to a load. More particularly, the system 200 generates and delivers a high voltage pulse to the load 206. In the system 200, a switched capacitor bank 202 includes one or more capacitor or voltage cells 210 that are typically arranged in series. The voltage cells 210 are used to store the energy that is delivered to the load 206 as a voltage pulse.

The voltage cells 210 are typically associated with switches 212 that are controlled by the switch drivers 204. By controlling the control signals 208, the switch drivers 204 can turn the switches 212 on/off. The state of the switches 212, determines whether the voltage cells 210 are charging or discharging through the load 206. In one embodiment, the switches can be switched on and or off at particular times. The timing of the control signals 208 can alter the rise time of the voltage pulse, the fall time of the voltage pulse, and the like. Some embodiments of the disclosure also enable the waveform to be shaped or otherwise controlled.

In one embodiment, the effects of stray capacitance are reduced such that more voltage cells can be connected in series. Because more voltage cells can be connected in series, a lower voltage source can be used to generate a larger voltage pulse. Also, the switch drivers can be rated for lower voltages. As a result, the cost and size of the pulse generators are typically reduced.

In one embodiment of the system 200, the voltage cells are charged in parallel and discharged in series by controlling the state of the switches 212. One of the advantages of the system 200 is that one or more of the voltage cells 210 can fail without preventing the system 200 from delivering a high voltage pulse to the load 206. The system 200 can be configured to deliver a positive voltage pulse, deliver a negative voltage pulse, or deliver either a positive or negative voltage pulse (bipolar output). In addition, the control signals 208 can be used to control a duration of the voltage pulse, a magnitude of the voltage pulse, a rise time of the voltage pulse, and the like or any combination thereof. The control signals may be optically coupled to the switch drivers 204 in one embodiment.

Figure 3A:
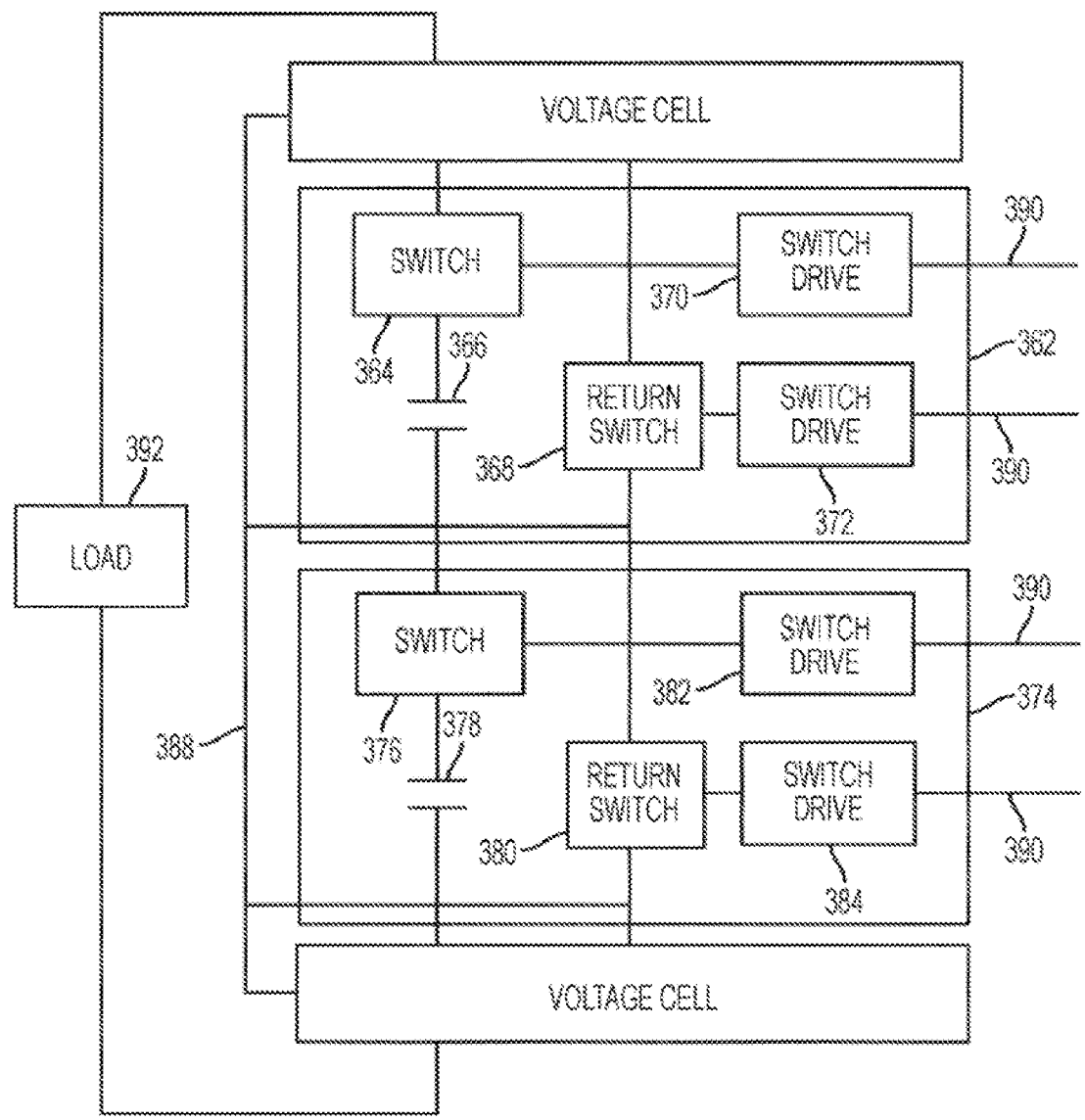
FIG. 3A illustrates a series of voltage cells and illustrates a main switch used to connect the capacitors in the voltage cells in series and return switches that provide a return path for a charging current.

FIG. 3A illustrates a diagram of one embodiment of a system for storing and/or delivering a high voltage pulse to a load. More particularly, FIG. 3A illustrates a few voltage cells connected in series, but one of skill in the art can appreciate the more or fewer voltage cells can be included. Each voltage cell is similarly configured and operate together to (i) charge the capacitors in parallel or independently of other voltage cells and (ii) discharge the capacitors in series. For example, the voltage cell 362 includes, in this example, a capacitor 366 that is used to store a charge. At the same time, the capacitor 378 in the voltage cell 374 is also storing a charge. When storing a charge, the switches 364 and 376 (and similar switches in other voltage cells) are off. Thus, the capacitors 366 and 378 can charge in parallel or independently.

The capacitors 366 and 378 are charged by the supply line 388 and because the switches 364 and 376 are off, the return switches 368 and 380 are turned on to provide a return path for the charging current provided through the supply line 388. As illustrated in FIG. 3A, the supply line 388 is a diode string and typically includes one or more diodes to separate the voltage cells. The switch drives 370 and 382 control the state of the switches 364 and 376, respectively. The switch drives 372 and 384 control the state of the return switches 368 and 380, respectively. The control lines 390 can be used to control the states of the switches 364, 376 and the states of the return switches 368, 380.

When the switches 364, 376 are turned on and the return switches 368, 380 are turned off, then the capacitors 366, 378 are connected and discharge in series to the load 392. In other words, connecting and discharging the capacitors 366, 378 in series generates a high voltage pulse that is applied to the load 392. Turning off the switches 364, 376 can terminate the pulse. Thus, the duration of the pulse can be controlled through controlling the switches 364, and 376. In other words, a non-functional voltage cell does not prevent a pulse from being generated or delivered to the load 392. In another embodiment, a diode is placed across the switch. The diode may only provide a discharge path when the switch 364, 376 is inoperative, for example. Thus, the switch 364, 376 can still isolate the capacitors in the voltage cells as the capacitors 366, 378 are charged.

Figure 3B:
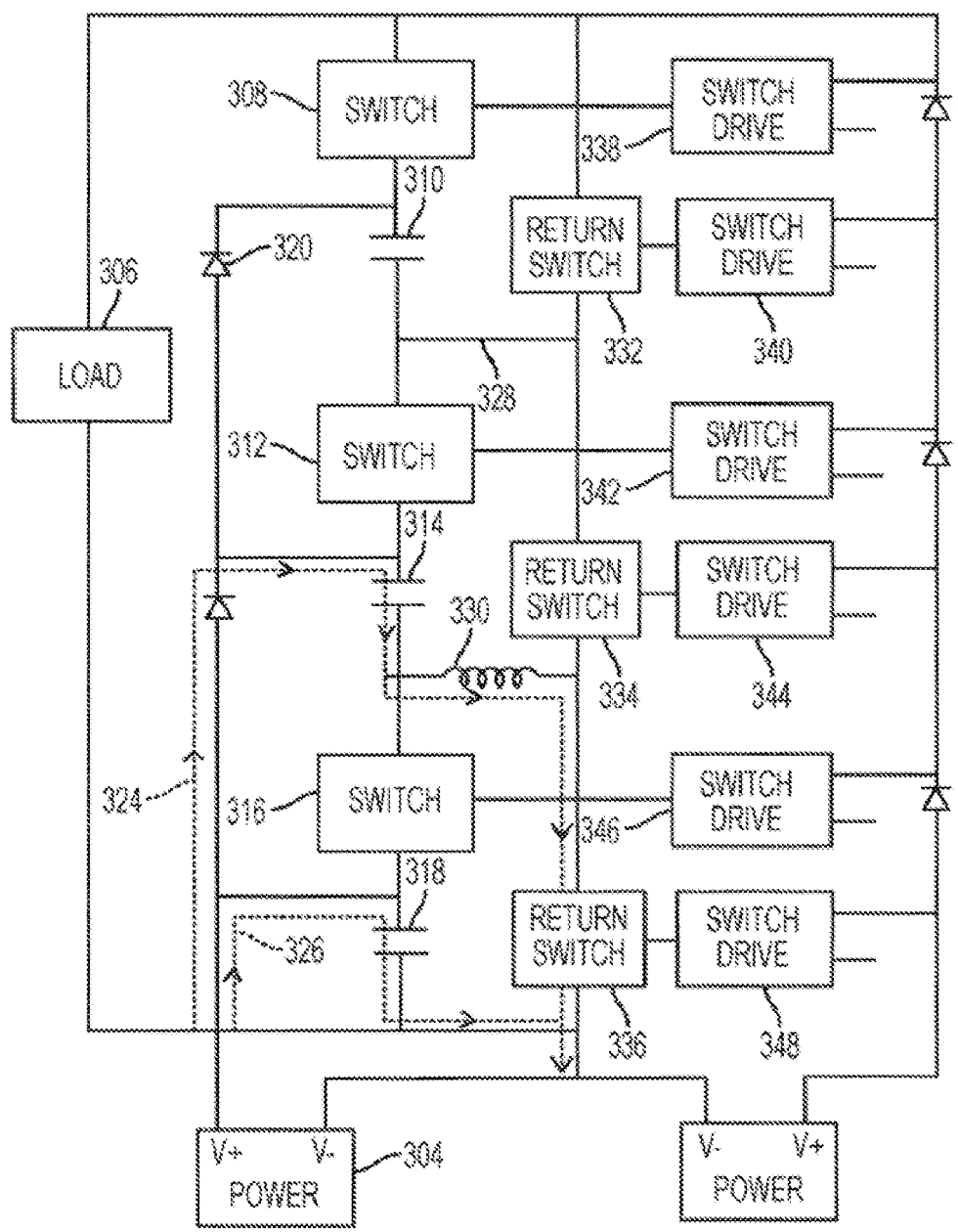
FIG. 3B is a more detailed diagram of one embodiment of a pulse generator and illustrates the path of the charging current for each voltage cell through a diode string supply and illustrates a diode string to provide auxiliary power to the switch drives.

FIG. 3B illustrates one embodiment of a high voltage pulse generator. This embodiment includes three voltage cells, but as previously stated, one of skill in the art can appreciate that more or fewer stages can be included. In this example, the capacitors 310, 314, and 318 store charge. Charge is stored by turning the switches 308, 312, and 316 to an off state.

When charging the capacitors 310, 314, and 318, the return switches 332, 334, and 336 are in an on state and the main switches 308, 312, and 316 are off. The path 326 illustrates a path of the current from the power supply 304 that charges the capacitor 318. At the same time, the power supply 304 delivers current through the path 324 to charge the capacitor 314. The path 324, after passing through the capacitor 314, proceeds through the return switch 336 via the connection 330. A similar path through the diode 320 and the return switches 334, and 336 is used to charge the capacitor 310. The current that charges the capacitor 310 proceeds through the connection 328 and then through the return switches 334 and 336.

During discharge of the capacitors, the switches 308, 312, and 316 are turned on using the control signals provided to the switch drives 338, 342, and 346, respectively. At the same time, the control signals are delivered to the switch drives 340, 344, and 348 to turn the return switches 332, 334, and 336 off. When the return switches 332, 334, and 336 are turned off, the discharge current does not flow through the return switches and is delivered to the load 306.

As illustrated in FIG. 3B, the connection 328 is shown as a wire or short while the connection 330 is illustrated as an inductor. Typically, all of the connections in the voltage cells are the same, but two types of connections are illustrated in this example to describe additional embodiments of the disclosure. When the connection is an inductor like the connection 330, the timing between turning the switch 316 on and the return switches off can be delayed. An inductive connection 330 can increase the rise time of the leading edge of the pulse.

For example, when the switches 308, 312, and 316 are turned on and the return switches 332, 334, and 336 are also on, a current begins to build in the inductive connections like the connection 330. After allowing the inductance to build, the return switches 332, 334, and 336 can be turned off. There is thus a delay in turning the switches 308, 312, and 316 off and turning the return switches 332, 334, and 336 on. The energy stored in the inductive connection 330 is then added to the energy being discharged from the capacitors 210, 314, and 318. Combining the inductive energy of the inductive connection 330 with the capacitive energy stored in the capacitors 310, 314, and 318 results in a faster rise time of the voltage pulse. One of skill in the art, however, can appreciate that an inductive connection does not require a delay to be incorporated between turning the switches 308, 312, and 316 to an on state and turning the return switches 332, 334, and 336 to an off state.

When the pulse generator is ready to terminate the high voltage pulse, the switches 308, 312, and 316 are typically turned off. The fall time of the high voltage pulse can be improved by turning on the return switches 332, 334, and 336. Opening the path through the return switches can help discharge stray capacitance and/or load capacitance, which improves the fall time of the high voltage pulse.

This example illustrates that the timing used to control the main switches 308, 312, and 316 and of the return switches 332, 334, and 336 can be used to control or alter the rise time and/or the fall time of the resulting voltage pulse. The shape of the voltage pulse can also be programmed in some embodiments.

Figure 4:
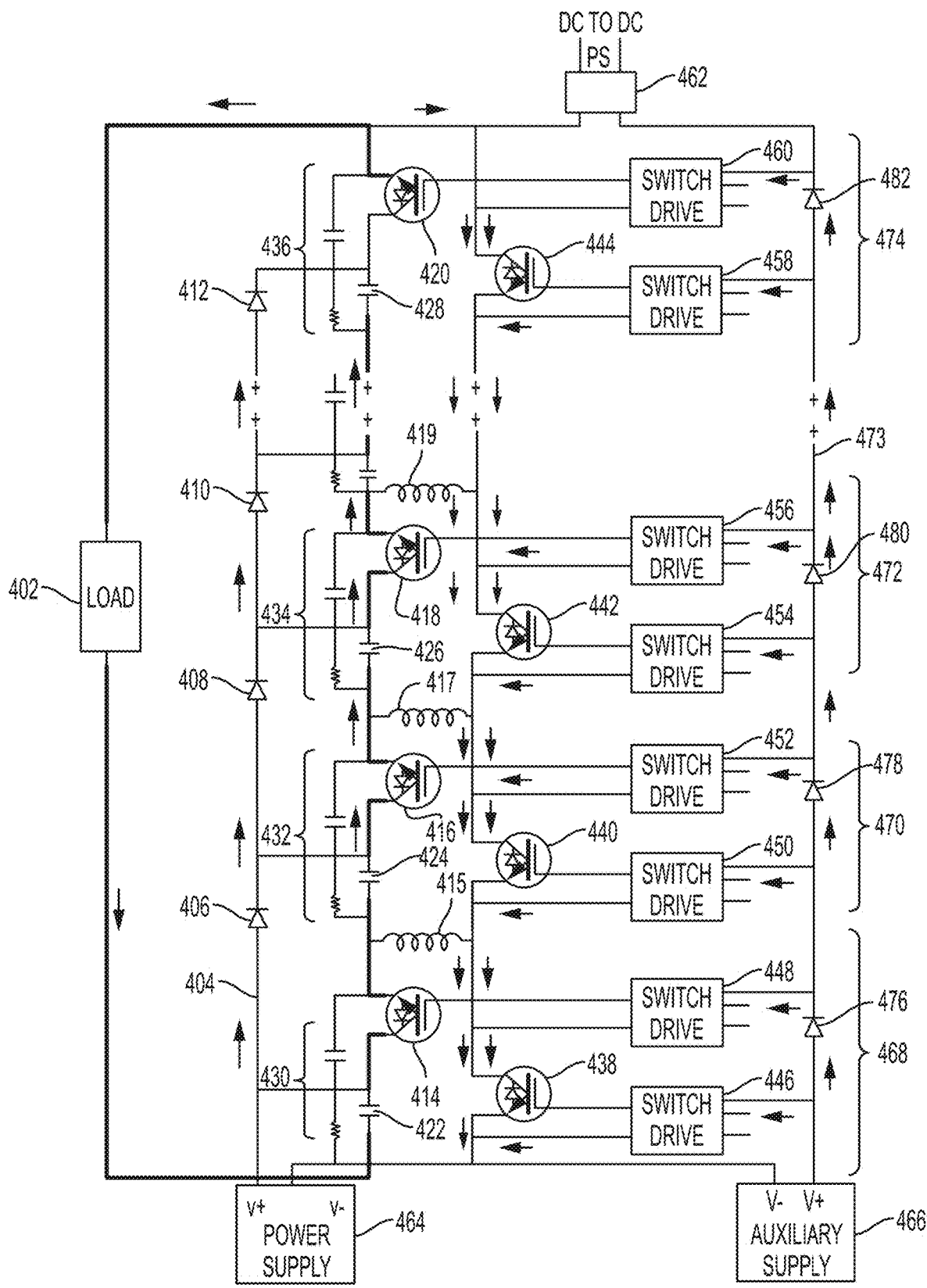
FIG. 4 illustrates one embodiment of a series of voltage cells arranged to generate a positive voltage pulse.

FIG. 4 illustrates a block diagram of a pulse generator that includes multiple voltage cells (also referred to herein as stages or sections). The example of the pulse generator illustrated in FIG. 4 generates a positive voltage pulse. FIG. 4 illustrates the voltage cells 474, 472, 470, and 468 that are connected as previously described using main switches 414, 416, 418, and 420 controlled by switch drives 448, 452, 456, and 460, and return switches 438, 440, 442, and 444 controlled by switch drives 446, 450, 454, and 458. In this example, the return path from the supply line 404 includes inductive connections 415, 417, and 419 from the charging capacitors 422, 424, 426, and 428 through the return switches.

FIG. 4 further illustrates an auxiliary path 473 that is used by the power supply 464 to provide power to the switch drives 446, 448, 450, 452, 454, 456, 458, and 460 (446-460). The auxiliary path 472 includes the auxiliary diodes 476, 478, 480, and 482 (476-482). The auxiliary diodes 476-482 help isolate the power supply 466 and help deliver pulse to the load 402.

The auxiliary diode string that includes the auxiliary diodes 476-482 represent a voltage drop for each diode in the diode string. Thus, the voltage available at a particular stage may be affected by the forward voltage drops of the diodes in the diode string. The voltage provided by the auxiliary power 466 simply provides sufficient voltage to overcome the forward voltage drops of the diodes and/or the charging switch voltage drops. If a large number of voltage cells are included, boosting voltage supplies may be included to provide adequate voltage levels.

The switch drives or switches 446-460, in one embodiment, can be any type of solid state switches known in the art. Bipolar junction transistors, field effect transistors, IGBTs, Darlington Bipolar transistor, solid state switches, and the like are examples of switches that can be used as described herein. Each voltage cell includes a switch drive for a main switch and a switch drive for a return switch. For example, the voltage cell 468 includes a switch drive 448 used to control the main switch 414. In this example, the gate of the main switch 414 is controlled by the switch drive 448. The switch drive 446 controls a state of the return switch 438.

The voltage available to the switch drives 446-460 is often reduced at successive switch drives by the voltage drop across previous diodes in the diode string and switches. Each switch drive can be driven from either ground or from the previous voltage cell. In one embodiment, DC-DC converters may be used to provide adequate power. In another embodiment, the switch and gate drives can be optically coupled from ground.

The energy storage capacitors 422, 424, 426, and 428 are charged by way of the diodes 406, 408, 410, and 412 and the return switches. Charging the capacitors in this manner eliminates the use of inductors, resistors, or isolated supplies that are common in conventional Marx Generators. In addition, the energy needed to drive the switches can also be provided through the diode string in the auxiliary path 473, eliminating the use of inductors, resistors, or isolated supplies or step down supplies that may otherwise be needed. The switches can be triggered by way of example, fiber optic coupling, transformer coupling, or by the auxiliary power diodes.

The diode string that includes the diodes 406, 408, 410, and 412 provides several advantages. First, the diode string isolates each voltage cell or voltage stage from other voltage cells or stages during the pulse.

FIG. 4 further illustrates balance networks 430, 432, 434, and 436. Each balance network typically includes a capacitor in series with a resistor and each balance network helps balance the stray capacitance to ground. The capacitance in the balance networks helps to equally distribute the voltages from section to section during the rise time and the fall time of the voltage pulse. Because the stray capacitance to ground associated with a particular voltage cell is typically different from the stray capacitance to ground associated with other voltage cells of the pulse transformer, the capacitance and/or resistance of each voltage cell can be adapted to match the stray capacitance "seen" by that voltage cell. Thus the capacitance of the balance network 430 may be different from the capacitance of the balance networks 432, 434, and 436. The capacitance of each balance network is selected to match the stray capacitance. The resistance in each balance network helps reduce ringing of the stray inductance and/or the stray capacitance. In an alternative embodiment as shown in FIG. 8, a ringing circuit may be included in one or more of the voltage cells of a pulse generator to provide at least a smooth droop compensation to the voltage pulse.

The power supply 462 can provide a source of power at the high voltage end of the load 402. For example, if the load 402 is a pulsed tube, then the power supply 462 can provide power for the filament or heater of the pulsed tube. Thus power supply 462 provides a power source at the high voltage end without additional equipment (so long as the supply is optically controlled).

Figure 5:
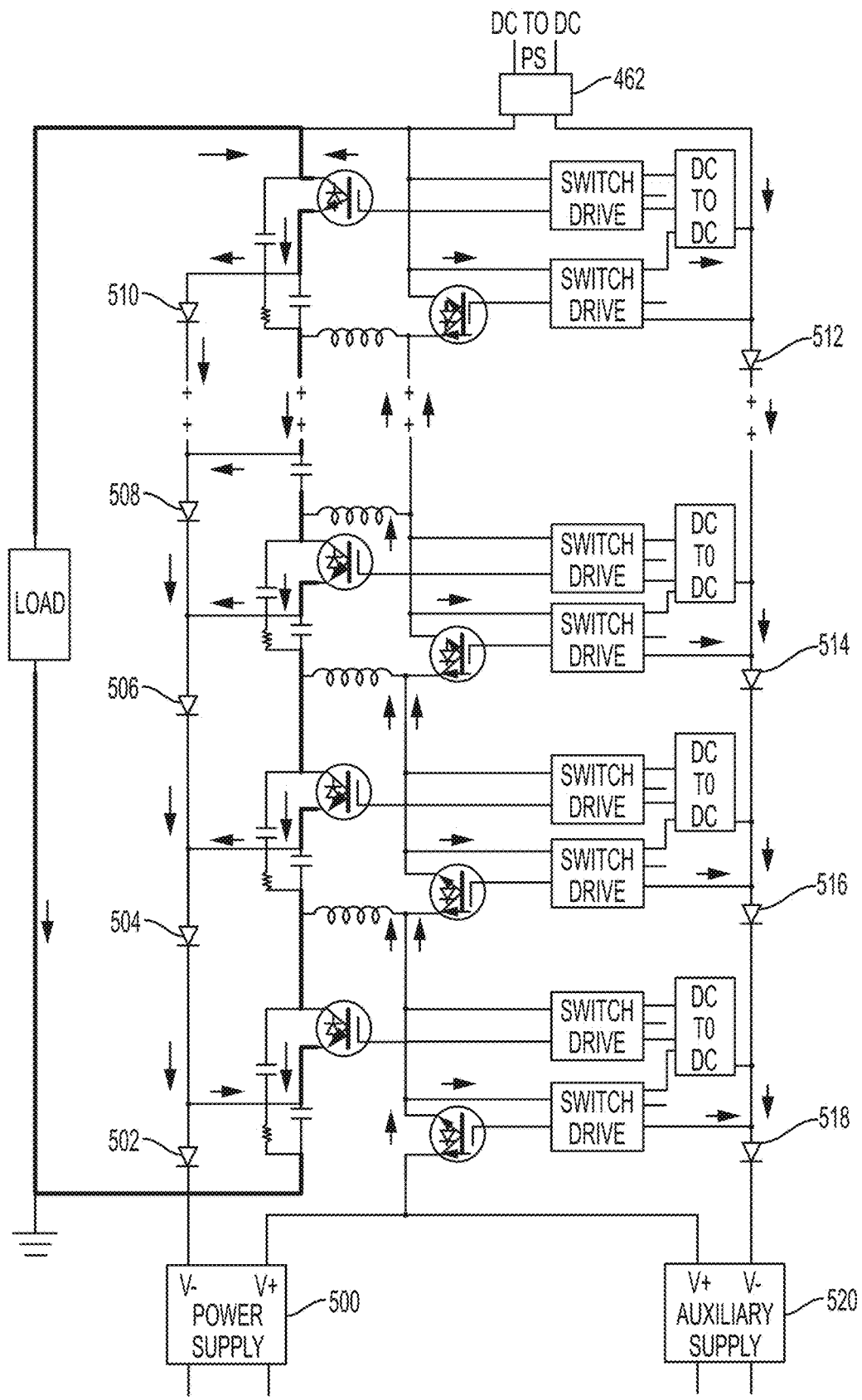
FIG. 5 illustrates one embodiment of a series of voltage cells arranged to generate a negative voltage pulse.

FIG. 5 illustrates another embodiment of a pulse generator. FIG. 5 is similar to the pulse generator illustrated in FIG. 4, with the difference that the pulse generator in FIG. 5 generates a negative voltage pulse whereas the pulse generator of FIG. 4 generates a positive pulse. The charging diodes 502, 504, 506, 508, and 510 and the auxiliary diodes 512, 514, 516, and 518 are configured to accommodate a negative power supply 500, 520. The switches and the return switches are also adapted to a negative supply.

Figure 6:
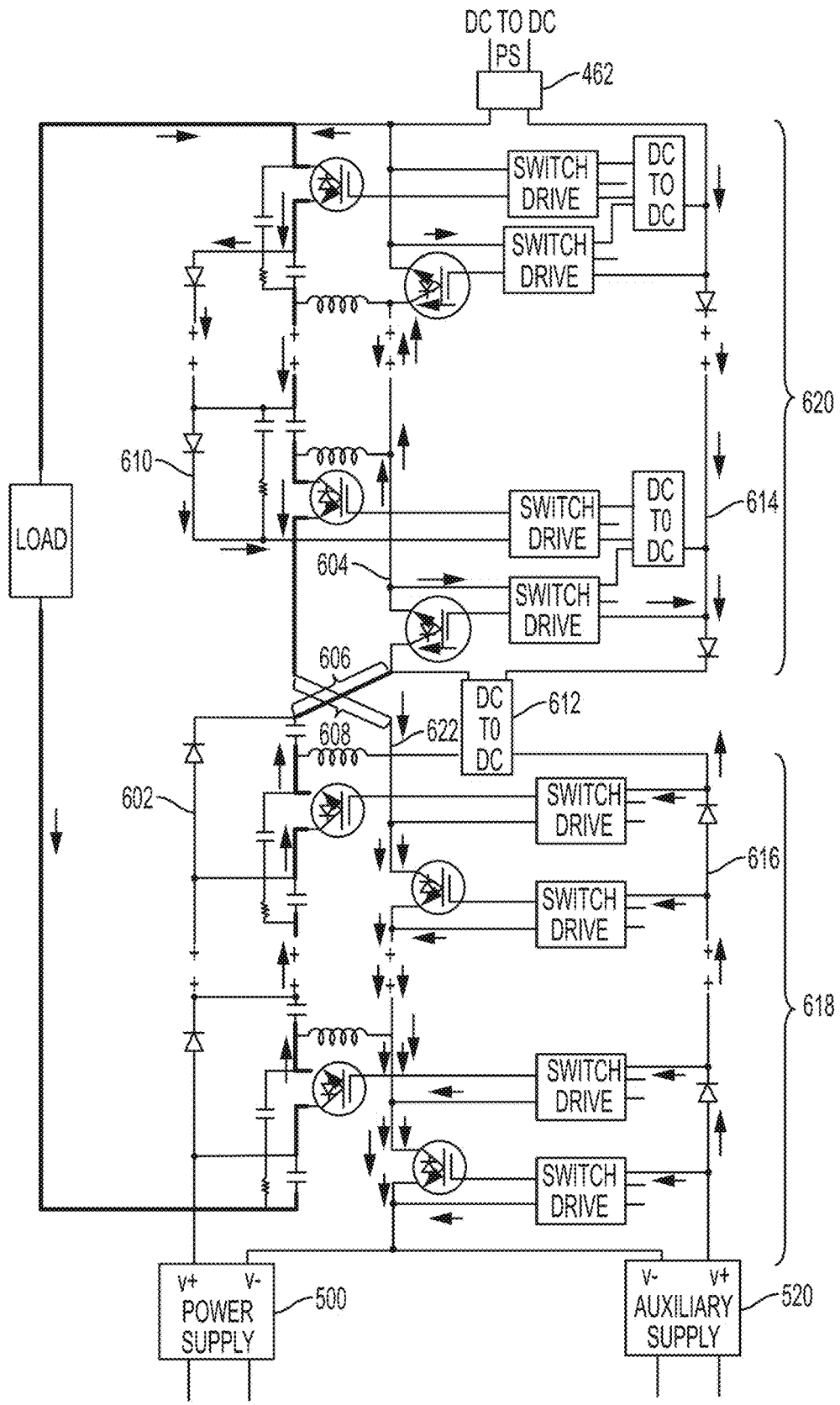
FIG. 6 illustrates an embodiment of a pulse generator that can generate both positive and negative pulses.

In FIG. 6 the positive voltage cells 618 generate a positive type voltage pulse and the negative voltage cells 620 generate a negative type voltage pulse. The voltage cells 618 are in series with the voltage cells 620. In this example, the diode string 602, which is used to charge the capacitors in the voltage cells 618, is connected with the return line switch string 604 of the voltage cells 620 via the connection 606. Similarly, the diode string 610, which is used to charge the capacitors in the voltage cells 620, is connected in series with the return line switch string 622 of the voltage cells 618 via the connection 608. The negative supply auxiliary diode string 614 is connected with the positive supply auxiliary diode string 616 using an inverting DC-DC supply 612. All of the capacitors in the positive voltage cells 618 and the negative voltage cells 620 can be charged at the same time.

Figure 7:
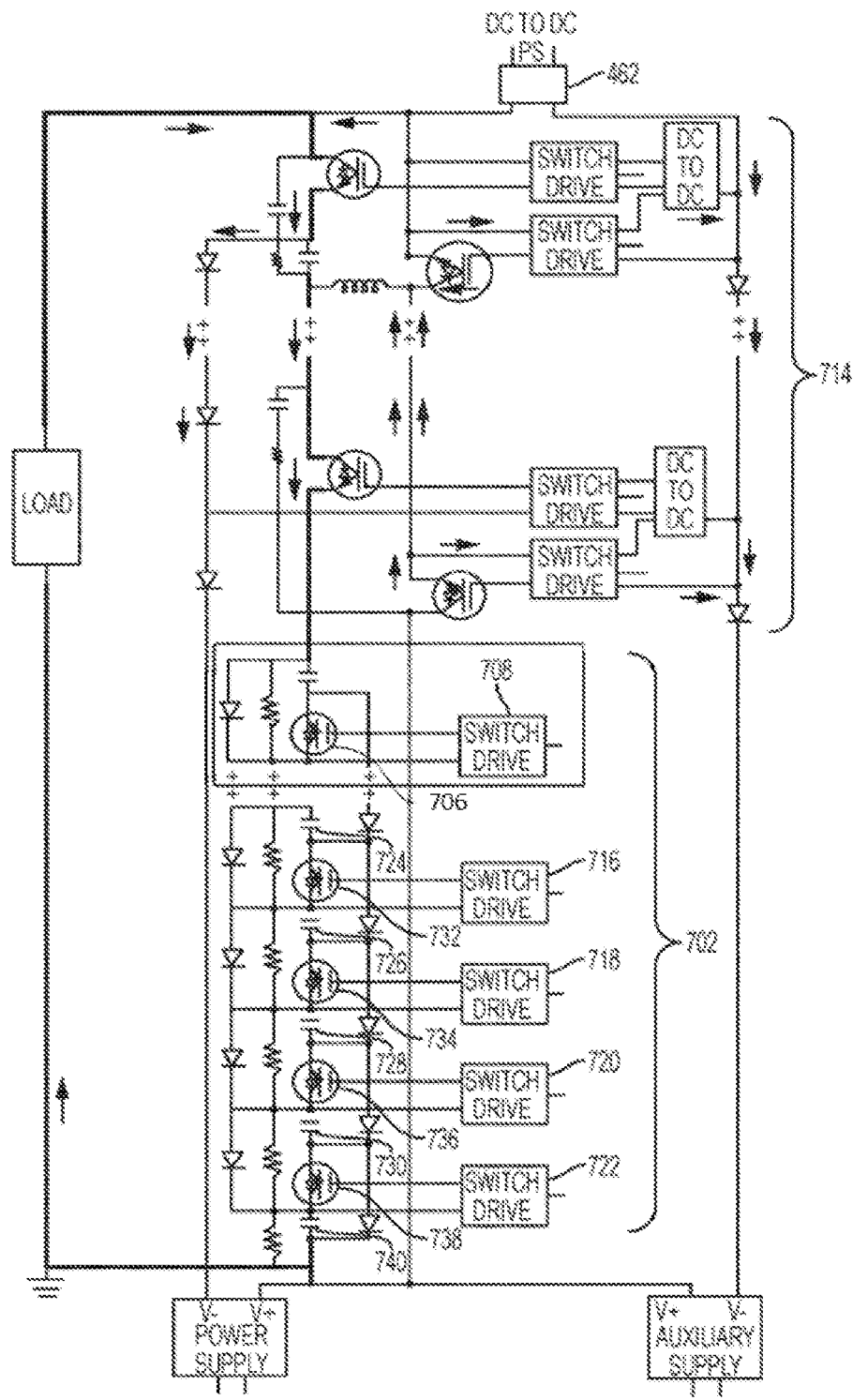
FIG. 7 illustrates another embodiment of a pulse generator that includes voltage cells arranged to provide droop control for the voltage pulse.

FIG. 7 illustrates an embodiment of a pulse generator that includes droop correction. More particularly, FIG. 7 illustrates droop correction for a negative type pulse generator. One with experience in the art would know that this droop correction could be used for generator of any polarity. The embodiment of the pulse generator illustrated in FIG. 7 includes a plurality of voltage cells 714 as previously described. In this example, the voltage cells 714 are connected with a series of cells 702 that are different from the voltage cells 714. In this example, the voltage cells 702 are configured such that they charge in series and discharge in parallel. The switch drives 708, 716, 718, 720, and 722, control the switches 706, 732, 734, 736, and 738 such that the capacitors 704, 724, 726, 728, 730, and 740 charge in series. At the same time, the storage capacitors of the voltage cells 714 are charging in parallel. However, the voltage cells 702 are configured to provide droop correction.

When the switches in the voltage cells 702 are on, the capacitors charge in series. During the voltage pulse, the voltage cells 702 can be discharged such that the shape of the voltage pulse can be adjusted. In one embodiment, the droop can be corrected across the entire pulse by controlling or delaying the discharge of the capacitors in the voltage cells 702. In another embodiment of the disclosure, the pulse may drive a pulse transformer with a core that needs to be reset. A reset supply could be included in series with the ground end of the charging switch to provide the core reset current. This eliminates the need to have a core reset inductor.

FIGS. 8A through 8D illustrate additional embodiments of a voltage cell including circuit that provides droop compensation. FIGS. 8A through 8D also illustrate the ability to isolate a defective or non-functioning voltage cell. When a pulse generator is constructed, it may include a plurality of voltage cells. Embodiments of the disclosure provide droop compensation by including a ringing circuit. However, only one or a few of these voltage cells need to have a ringing circuit in order to provide droop correction or droop compensation. The majority of the voltage cells can be as described herein and do not necessarily need to include the ringing circuit.

In this example, the capacitors 802 are used to store the charge that is delivered to a load. Other capacitors in the serially connected voltage cells also store charge that will be delivered to the load as a voltage pulse. As previously described, the capacitors 802 can be charged in series as the current flows from the charging source 824 through the diode 836. The current used to charge the capacitor(s) in the voltage cell 820 flows from the charging power 824 through the return switch 814, which is on, and up to the voltage cell 820 and then back through the diode string 822 to the charging power 824.

Figure 8A:
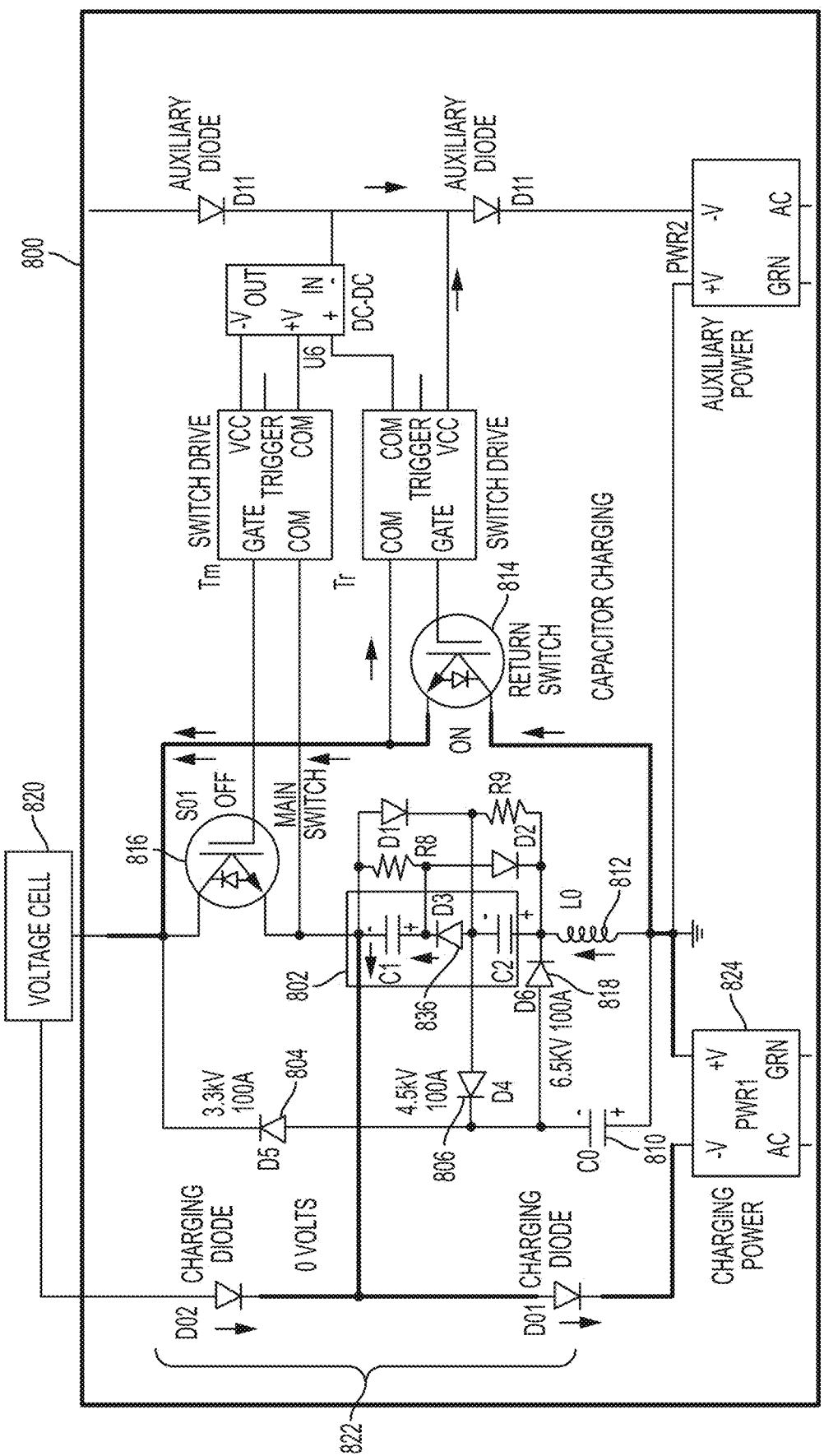
FIGS. 8A through 8D illustrates an embodiment of a portion of a pulse generator that provides droop control in a pulse generator.

In this manner, the capacitors 802 are charged, as illustrated in FIG. 8A, when the main switch 816 is off and the return switch 814 is turned on. When the return switch is turned on in this manner, current can flow to the capacitors in the next voltage cell 820. Because the main switches in the series connected voltage cells are turned off, the capacitors 802 do not discharge. The current through the return switch 814 can return through the diode string 822. In this manner, the capacitors in the voltage cells are charged effectively in parallel by the charging power supply 824.

The voltage cell 800 in FIG. 8A also illustrate an inductor 812, a capacitor 810, and diodes 804, 806, and 818. The diodes 818 and 806 prevent the capacitors 802 from discharging. When the main switch 816 is turned on, the diode 804 prevents the current stored in the capacitors from discharging through the capacitor 810 and insures that the voltage pulse is delivered to the load.

As previously indicated, a voltage pulse may begin to droop over time. The ringing circuit that includes the capacitor 810 and the inductor 812 can provide droop compensation that is smoother than the droop compensation illustrated in FIG. 7. In this case, as the capacitors 802 begin to discharge, the ringing circuit begins to ring, creating a half sine wave in one embodiment that provides droop compensation to the voltage pulse. Advantageously, this provides smooth droop compensation in one embodiment rather than jagged or saw tooth compensation to the voltage pulse.

Figure 8B:
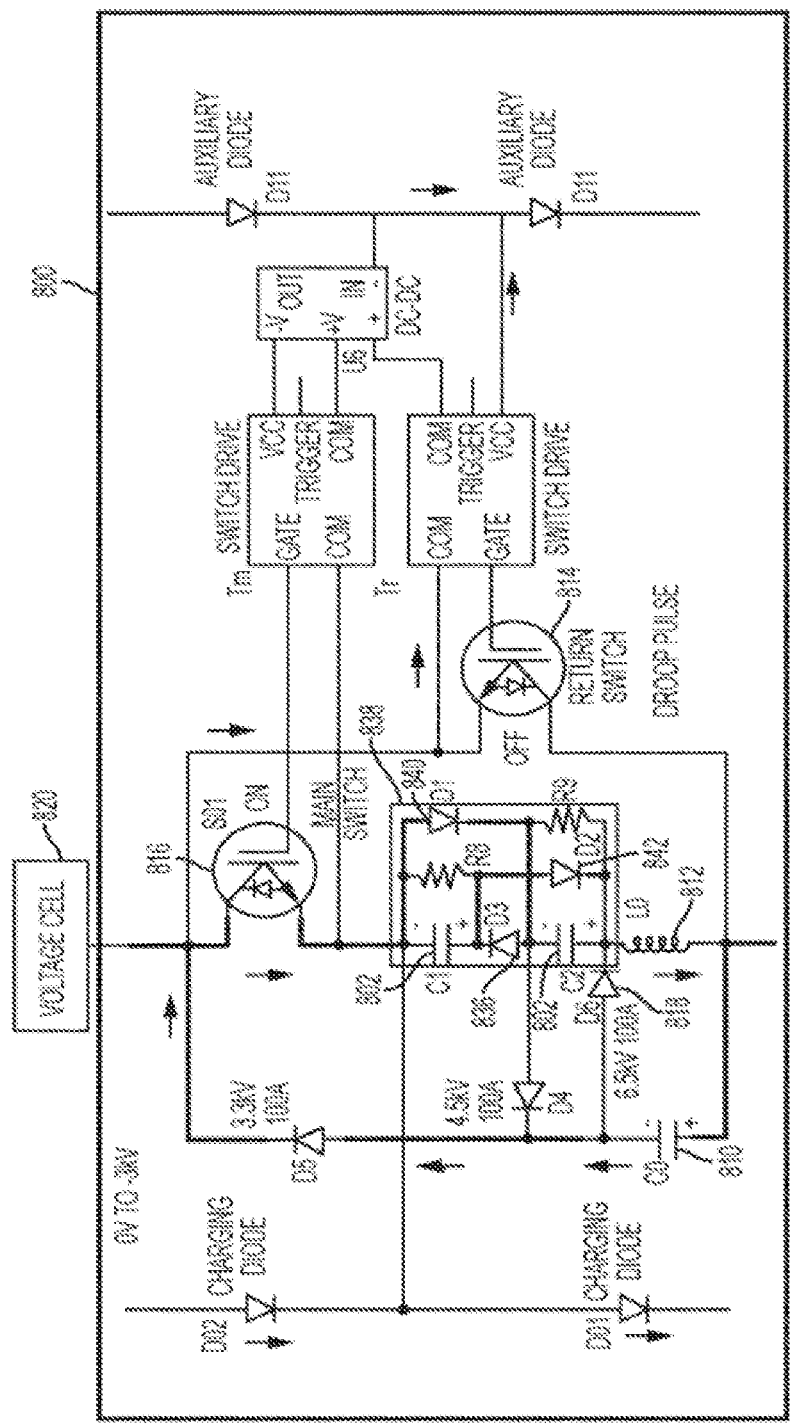

More specifically, FIG. 8B illustrates a voltage cell that is discharging and providing droop compensation. In this example, the main switch 816 is turned on and the return switch 814 is turned off. Thus, the capacitors 802 of the serially connected voltage cells 800, 820 (additional voltage cells may be similarly connected as previously described) are connected and are discharging through the open switches to the connected load, which may be in parallel to the serially connected voltage cells.

In a voltage cell that includes a ringing circuit, the diodes 842, 836, and 840 enable the capacitors 802 to charge in series and also cause the capacitors to discharge in parallel. Although the capacitors 802 in the cell 800 charge in series, the capacitors 802 are charging in parallel with other capacitors in other voltage cells as previously described.

As a result, the voltage cell 800 is connected with the ringing circuit such that when the switch 816 is turned on, the capacitors have half of the voltage. The ringing circuit begins to ring and the capacitor 810 is charged to twice the voltage. The capacitor 810 thus charges in a sine wave and provides smooth boost compensation to the voltage pulse. In this example, the circuit 838 includes diodes and resistors that provide a path for the charge to discharge in parallel.

The droop compensation or droop correction is provided by the ringing circuit. In this example, the inductor 812 and the capacitor 810 begin to ring and as the capacitor 810 begins to charge, it can discharge through the switch 816, which is on, and to the load. The ringing has the effect of providing droop compensation to the voltage pulse. By varying the values of the capacitor 810 and of the inductor 812, the droop compensation can be selectively provided and controlled. In other words, the capacitor 810 begins discharging after the capacitors in other voltage cells are discharging, thereby compensating for voltage droop in the voltage pulse.

Figure 8C:
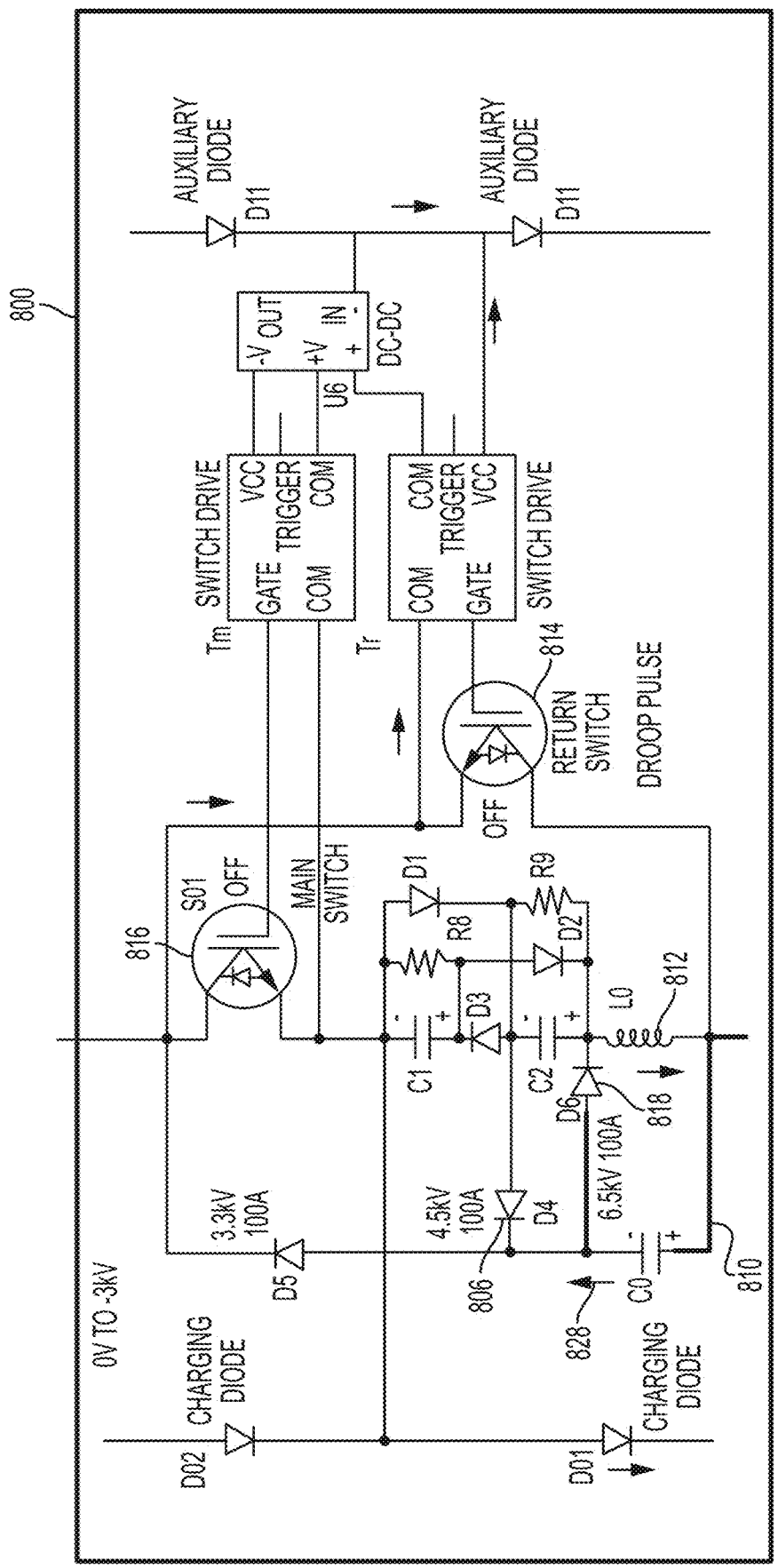
Figure 8D:
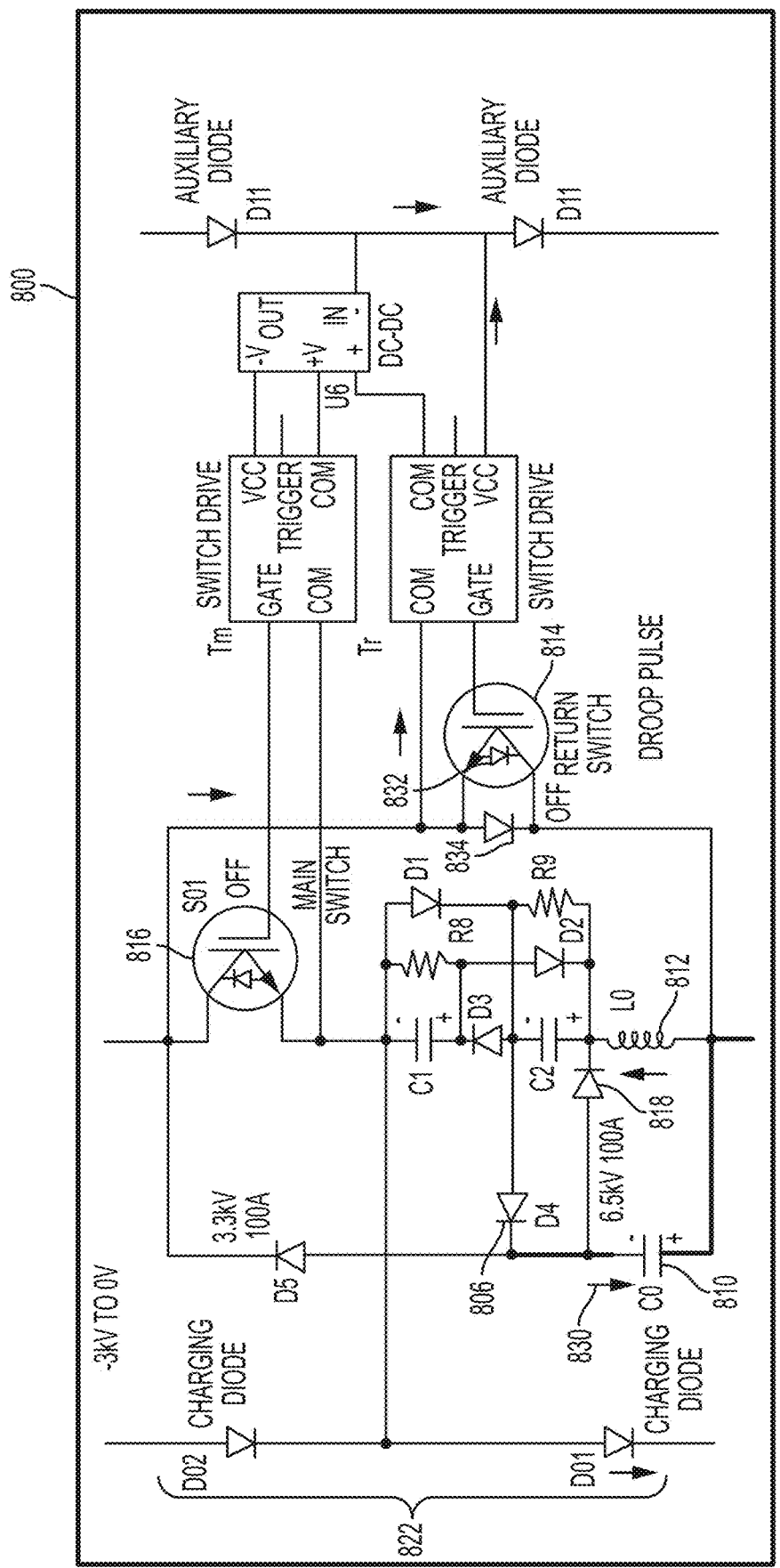

FIGS. 8C and 8D illustrate the ringing circuit after the main switch 816 is turned off after the pulse is provided. When the main switch 816 is turned off (along with the main switches in other voltage cells), the ringing circuits of the voltage cells become isolated. The residual current in the inductor 812 or charge in the capacitor 810 discharges in the ringing circuit in an isolated manner. FIG. 8C, for example, illustrates that the current 828 discharges from the capacitor 810 through the diode 818. FIG. 8D, on the other hand, illustrates that the current in the inductor 812 discharges to the capacitor 810 through the diode 806. In this manner, the ringing circuit illustrated in FIGS. 8A through 8D is an example of providing smooth droop compensation to a voltage pulse.

FIG. 8D also illustrates an embodiment of the disclosure that can isolate a defective cell or isolate a cell that may not be functioning correctly without having an adverse impact on the generation of a voltage pulse. In this case, the return switch illustrated in FIG. 8D (and in other Figures) includes a diode 832. If the return switch does not include such a diode, the diode 834 can be included in the voltage cell across the return switch in this example. The diode 832 provides a path for the discharge current when the return switch 814 is off and the cell is defective. Thus, the diode 832 or 834 becomes an isolation diode that enables the pulse to be delivered when a particular voltage cell is inoperative for various reasons.

Usually, when the voltage cell 800 is operating normally, the diode 832 or 834 is reverse biased during discharge such that current discharges through the capacitors. When the cell is defective, the switch 816 can be turned off and this enables the discharge current to pass around the defective voltage cell through the diode 832 or 834. When the return switch is on to permit charging of the capacitors 802, the main switches are off and the current is prevented from discharging through the diode 832 because the voltage cells are effectively isolated when the main switches are off and the diode 832 is reversed biased. Alternatively, the discharge current can be delivered through the diode string 822.

In one embodiment, a pulse generator that includes multiple voltage cells can be constructed. Such a pulse generator has multiple redundancy that provides protection for several events. If a voltage cell is defective, the amount of charge initially stored in the capacitors of the remaining voltage cells can be altered such that the voltage pulse is not affected. In this case, the pulse generator may include more voltage cells than are required for a particular duty. Also, the voltage cells are constructed in a manner that permits the voltage pulse to be delivered even when a cell is defective. In other words, embodiments of the disclosure provide cell isolation and redundancy.

Embodiments of the disclosure provide several advantages and benefits. The shape of the pulse as well as the rise time and the fall time can be programmed or controlled. For example, the rise time and fall time can be controlled by selection of the components in the ringing circuit. The rise time and/or the fall time can also be controlled by timing when the main switches and/or the return switches are turned on/off. In addition, the length of the pulse can also be programmed.

For example, a pulse generator typically includes enough voltage cells to generate a wide range of voltage pulses. In some instances, not all of the voltage cells may be needed to generate a particular pulse. By controlling the timing of the main switches and the return switches can control the length of the voltage pulse. In another example, by turning the return switches on at the end of the pulse, the fall time of the voltage pulse can increase because any residual voltage has another path in which discharge can occur.

In some embodiments, the requirements of a pulse to be generated by a Marx generator can be sufficient to require two or more Marx generators to be used in parallel to produce the desired pulse. In some instances, a parallel Marx topology can be used to reduce the current contribution of each Marx generator to an acceptable level so as to not require an export-controlled switch, which can allow the system the freedom of commercial convenience (i.e., the system can be shipped across borders while still remaining in compliance with various export-import control provisions). In other instances, the voltage and current requirements of a pulse may be substantial enough to warrant the use of a parallel Marx topology so as to allow high power IGBT switches to operate at reduced voltages through manipulation of the pulse transformer turn ratio so as to minimize the probability of radiation damage or other failure modes associated with high voltage, high current solid state devices.

As an example, if a single Marx generator is required to generate a 10000 volt pulse at 2000 amps, then the IGBT switches required to create such a pulse in a single Marx generator may exceed the voltage and current ratings for commercially available switches and two parallel marx' would need to be employed using commercially available 1000 A switches as the current is summed to 2000 A at the output. Generally, commercially available switches are designed to handle approximately 4-1000 amps of current. In a separate case, in order to generate the 10,000 volt, 1000 amp pulse using a single Marx generator, a 1000 A switch may need to be employed. Such higher rated switches may violate various export/import controls imposed by various countries. For instance, in the United States, the International Traffic in Arms (ITAR) regulations, may prohibit or severely limit the export of a Marx generator containing a switch whose voltage and current ratings were adequate to generate the pulse described above using a single Marx generator. For instance, current ITAR regulations only allow for switches that have an anode peak voltage less than or equal to 2,000 volts, an anode peak current rating of less than 500 amps, and a turn-on time of greater than 1 microsecond. If the voltage and current requirements of a pulse are sufficient to require a switch that exceeds the ITAR regulated switching regulations when implemented using a single Marx generator, such a device may not be commercially viable. Thus, as an example, if a pulse required over 500 amps of current and a pulse of over 2,000 volts, then in order to create a system in which such a pulse is generated using a single Marx generator, the generator would likely require non-ITAR compliant switches.

Thus for an output pulse that required over 500 amps of current, or over 600 amps, or over 700 amps, or over 800 amps of current, the system described below could be utilized to ensure an ITAR compliant implementation.

By employing the parallel Marx topology described in detail below, each individual Marx may include switches and other component that are export/import compliant, while the collective pulse created by the parallel Marx generators can generate pulses with a high enough voltage and current to satisfy the requirements of a user of the pulse. Example uses of pulses that can benefit from a parallel Marx generator technology include electron beams, proton beams, spectrometers, accelerators, radar transmitter, high-impedance electron guns, ion tubes, liquid polarizing cells, and electroporation. The above list should only be understood to be example contexts in which a high voltage pulse may be required, and should not be construed as limiting. Any context in which a high voltage pulse is required can benefit from a parallel Marx topology.

Figure 9:
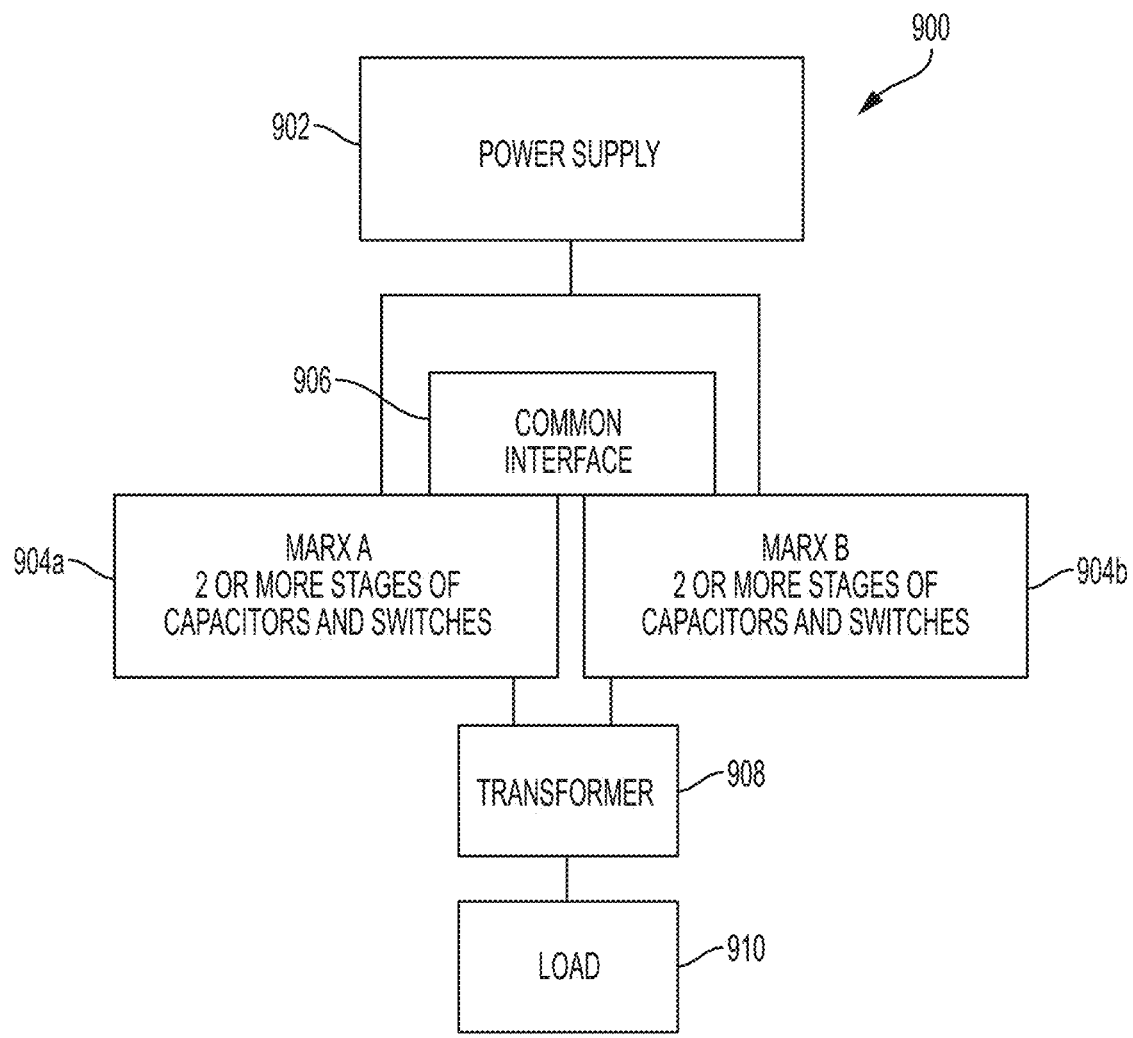
FIG. 9 illustrates an exemplary parallel Marx generator topology according to examples of the disclosure.

FIG. 9 illustrates an exemplary parallel Marx generator topology according to examples of the disclosure. The parallel Marx generator system 900 can include a power supply 902 to that is used to provide power (i.e., current) to each of the Marx generators 904a and 904b. The system 902 can also include two Marx generators 904a and 904b that can be collectively used to generate a high-powered pulse. In the example of FIG. 9, the system 902 includes two parallel Marx generators 904a and 904b, however the example should not be construed as limiting. A system that employs parallel Marx generators can include a plurality of Marx generators (for example 3, 4, 5, etc.). One of skill in the art would understand that the system and methods discussed in detail below could be employed on a parallel Marx generator topology that included more than two parallel Marx generators.

Each Marx generator 904a and 904b can be implemented using the systems and methods described above with respect to FIGS. 1-8, and can be identical to one another in terms of circuit layout and components used. Each Marx generator 904a and 904b can be connected to and receive power from the power supply 902, and can further include a common interface 902 (described in further detailed below). Each Marx generator 904a and 904b can be outputted to transformer 908. Transformer 908 can step up the voltage collectively generated by each Marx generator and step down the current generated by each Marx generator to the desired levels required by the context in which the pulse is being employed. The amount of voltage step up and current step down can be dictated by the ratio of the primary windings of the transformer 908 to the secondary winding of the transformer. Thus, depending on your pulse's voltage needs, a transformer can be designed with the appropriate ratio between the primary and secondary windings to produce a step up affect that can yield the desired pulse. As further described in detail below, the transformer 908 can also serve to balance the current generated by each Marx generator.

Finally the output of the transformer 908 can be used to drive a load 910. The load 910 can represent the device that utilizes the pulse created by the system 902 such as an electron beam, spectrometer, radar, etc.

The transformer 908 can serve two primary purposes. First, the transformer 908 can act to step up the voltage outputted to the load 910 from the Marx generators 904*a* and 904*b*. The amount of step up of the voltage and the step down of the current can be based on the ratio of turns between a primary wining of the transformer (i.e., the side of the transformer that interacts with the Marx generators) and the secondary winding of the transformer (i.e., the side of the transformer that is connected to the load 910). Thus, in one example if Marx generators 904*a* and 904*b* collectively produced a pulse that is 1,000 amps and 10,000 volts, however a pulse of 130,000 volts is required for the load 910, then the ratio of the primary winding to the secondary winding can be 1:13. In this way, the voltage will be stepped up by a multiple of 13, (i.e., from 10,000 volts to 130,000 volts) while the current is stepped down by a ratio of 13:1 (i.e., 1,000 amps to approximately 75 amps.

Figure 10:
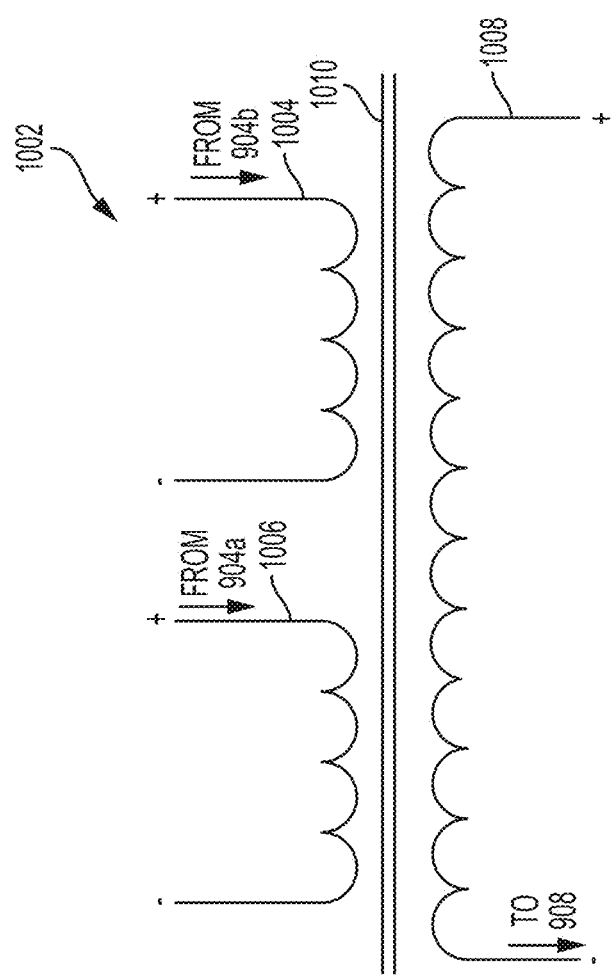
FIG. 10 illustrates an exemplary transformer according to examples of the disclosure.

FIG. 10 illustrates an exemplary transformer according to examples of the disclosure. The transformer 1002 can include two primary windings 1004 and 1006. The two primary windings 1004 and 1006 can receive the output signals of Marx generators 904*b* and 904*a* respectively. The primary windings 1004 and 1006 can be configured with respect to secondary winding 1008 such that the primary windings are able to transfer electrical energy to the secondary winding via electromagnetic induction.

As discussed above, the ratio of turns between the primary windings 1004 and 1006 and the secondary winding 1008 can be manipulated in order to achieve the desired amount of step up in the voltage in order to generate a pulse with a higher voltage than the voltages of the pulses produced by Marx generators 904*a* and 904*b*. Also as discussed above, the transformer 908 can serve two functions. The second function can be to balance the current being outputted by each Marx generator 904*a* and 904*b*.

To illustrate the concept of current balancing, an example scenario is provided below. While ideally Marx generators 904*a* and 904*b* would produce the same output current, realistically this may not be true. For instance, Marx generator 904*a* may produce a pulse with a 550 amp current while Marx generator 904*b* may produce a pulse with a current of 450 amps. The imbalance in the current between the two Marx generators could be due to different components with the Marx generators 904*a* and 904*b* behaving differently during operation of the circuit (these different behaviors could be caused by manufacturing differences/irregularities). For instance if during operation of the system 900, IGBT switches within Marx generator 904*a* may exhibit different characteristics such as rise and fall times, resistance, etc., when compared to the IGBT switches located within Marx generator 904*b*. These differences can lead to the current generated by each Marx generator to be different from one another.

Returning to the example of Marx generator 904*a* producing 550 amps of current when generating a pulse, and Marx generator 904*b* producing 450 amps of current when generating a pulse, such a disparity in output current could have an overall effect on the life of the parallel Marx generator device's lifespan. For instance, if Marx generator 904*a* is operating at the higher 550 amps in contrast to Marx generator 904*b*'s 450 amps, Marx generator 904*a* may have a decreased lifetime and could potentially fail at a faster rate than Marx generator 904*b*.

Transformer 908 however can be configured to ensure that each Marx generator is contributing approximately the same current to the transformer that is then ultimately used to drive the load 910. As is known in the art, the magnetic field inside of a transformer tends to remain balanced. In other words, the magnetic flux path in the transformer will try to maintain uniformity throughout the field. In a pulse that is very short in duration (for example 5 millonths of a second that is charged in 2 milliseconds and is discharged in microseconds) there can be a substantial chance that in the absence of a transformer the currents being outputted by each Marx generator in a parallel Marx generator topology would not be equal. The transformer can act to ensure that the currents being generated by each Marx generator is substantially uniform with respect to one another. In a configuration in which two parallel Marx generators are configured to be coupled to a single secondary winding within the transformer 908, as illustrated in FIG. 10, the transformer 908 will try to maintain a uniform flux through the magnetic path 1010 between the two primary windings 1004 and 1006, and secondary winding 1008. Therefore if Marx generator 904*a* produces 500 amps of current, the transformer 908 in trying to keep the magnetic flux uniform will draw 500 amps from Marx generator 904*b*. In this way when the transformer 908 sees that the current of one of the Marx generators is going above the current being produced by the other Marx generator, the transformer can create more resistance to that current with respect to the current being generated by the lower current Marx generator, and therefore can act as an equalizer.

This concept of balancing the currents provided by each Marx generator in a parallel topology can be also applied to parallel Marx generator topologies that have 3, 4, or any number of parallel Marx generators. Thus, the transformer can serve two purposes with respect to a parallel Marx topology. First, it can provide the required voltage and current needed for a given load and second it can provide current balancing to ensure that each Marx generator is providing roughly equal amounts of current to the transformer for eventual delivery to a load.

Another advantage that can be harnessed from employing a parallel Marx generator topology, is that by using parallel Marx generators to share in the work required to generate a high-power pulse, the Marx generators themselves can be built from smaller more reliable components. For instance, employing a parallel Marx generator topology can allow you to use lower current switches which can be typically faster than higher power switches. Lower current switches can be made small and more lightweight when compared to high-power switches, and the smaller switches in turn provide the system with a faster rise and fall time when compared to a Marx generator that employs a high power switch.

Also, failures of the system can be more readily mitigated since anytime any individual Marx generator fails, only a portion of the system (i.e., the failed Marx generator) rather than the entire system would need to be replaced. The geometry of a parallel Marx generator topology could allow for easy replacement of any individual Marx generator.

In one example, the geometry of the parallel Marx topology could allow for any individual Marx generator to be configured so it can be easily attached or detached from the broader system, thereby allowing for quick and easy replacement should an individual Marx generator fail.

Referring back to FIG. 9, the system 900 can also include a common interface 906. Common interface 906 can provide a user interface for controlling the entire parallel Marx topology without needing to control each individual Marx generator separately. The common interface can allow for a user command on one interface to be implemented in both Marx generators 904a and 904b. Furthermore, common interface 906 can allow for continuous fault monitoring from both Marx generators, and can be configured to handle any faults from either or both Marx generators. If a fault does occur, the common interface can obviate the need to replace the common interface box itself, thus allowing only the Marx generators to be replaced in the case of a fault.

In one example, the common interface 906 can include an optical to digital converter that can allow a "trigger" of a Marx generator. A "trigger" can refer to a command to each Marx generator to open its charge IGBTs and close its discharge IGBTs so as to generate a pulse. The trigger can be stopped when the user desires an end to pulse. Upon removal of the trigger, the charge IGBTs can close, while the discharge IGBTs can be opened.

The control interface 906 can also allow for a user to set the number of electrical arcs that can be detected in the device before a fault condition is indicated. In one example, a user may want to tolerate 4 or 5 arcs in ten days that might be expected with normal operation of the system. However, if 25 arcs were to occur in a very short amount of time, the user may want to be notified of this so that they can proceed to shut down the system 900 to determine the root cause of the high frequency of arcing.

The control interface can also detect overcurrent conditions, whether one or more of the IGBTs in the circuit have failed, temperature conditions, flow sensors, and any other general fault condition. In some embodiments, the common interface can receive the power from the power supply, and then distribute the power to each individual Marx generator. Generally, by employing a common interface to control all of the Marx generators, each individual Marx generator may not require its own separate control interface, thus decreasing the cost and footprint of the system.

Implementing the parallel Marx topology described above can confer many advantages. For instance, the system can be highly modular, easy to service, and can include an optimized LRU. Furthermore, the system maybe radiation resistant, have a low volume/footprint, can include commercial of the shelf switches and capacitors, include a simple interface, and can possess a longer lifespan when compared to a single Marx generator that is trying to generate a high energy pulse.

Figure 11:
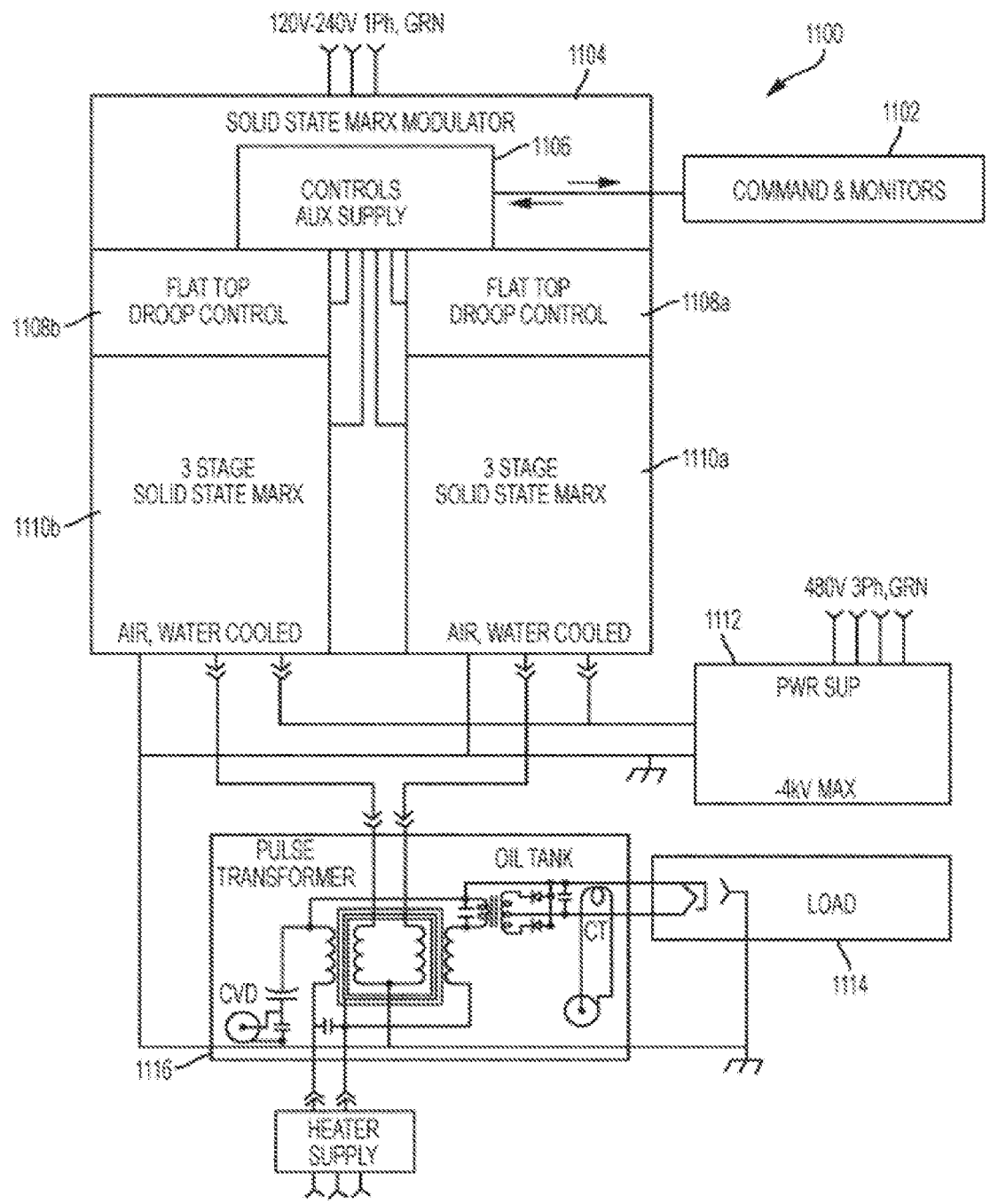
FIG. 11 illustrates another exemplary parallel Marx topology according to examples of the disclosure.

FIG. 11 illustrates another exemplary parallel Marx topology according to examples of the disclosure. As illustrated in FIG. 11, the system 1100 can include two parallel Marx generators 1110a-b that are configured to operate in parallel with one another. In the example of FIG. 11, the Marx generators 1110a-b are shown as 3 Stage Solid State Marx generators that can be air or water cooled. The paralleled Marx modules can have their capacitors charged by a common high voltage supply 1112 that in turn is powered by 3-phase 480V wall power. The paralleled Marx modules auxiliary power system 1104 can be powered by common 120V-240V 1-phase bus.

The system 1100 can include a common interface 1102 that can be powered by a control auxiliary power supply 1106. The system 1100 can also include flat top droop control units 1108a-b (one for each Marx generator 1110a-b). Flat top droop control units 1108a-b (as described above) can be employed to help the system 1100 produce pulses that have flat tops, i.e., the change in voltage/current remains substantially steady during the duration of the pulse.

The system 1100 can also include a transformer 1116 that operates in the manner discussed above with respect to FIG. 9. The transformer 1116 can be immersed in an oil tank as shown in the figure to limit the amount of electrical arcing experienced by the system 1100. Finally, the system 1100 can be connected to a load 1114 that receives the pulse generated by the parallel Marx topology system.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims.

What is claimed is:

1. A electronic device for generating a pulse, the device comprising:
   a plurality of Marx generators, wherein the plurality of Marx generators are connected in parallel;
   a common interface, wherein the common interface is configured to send and receive one or more control signals to and from each Marx generator of the plurality of Marx generators; and
   a transformer, wherein the transformer comprises a first winding to receive a first output signal from a first Marx generator of the plurality of Marx generators and a second winding to receive a second output signal from a second Marx generator of the plurality of Marx generators connected in parallel.

2. The device of claim 1, wherein each Marx generator of the plurality of Marx generators is configured to output a current, and wherein the transformer is configured to cause the currents outputted by each Marx generator to be substantially equal.

3. The device of claim 1, wherein the transformer includes a plurality of primary windings, each primary winding of the plurality of the primary windings associated with one Marx generator of the plurality of Marx generators, and a secondary winding, wherein each primary winding receives one of the plurality of signals generated by the plurality of Marx generators, and wherein the secondary winding transmits the output pulse based on the plurality of received signals.

4. The device of claim 1, wherein each Marx generator of the plurality of Marx generators includes one or more switches, and wherein each switch of the one or more switches has an anode peak voltage rating of less than 2000 volts.

5. The device of claim 4, wherein each switch has an anode peak current ratio of 500 amperes.

6. The device of claim 4, wherein each switch has a turn-on time of 1 microsecond or less.

7. The device of claim 1, wherein the common interface is configured to receive commands from a user regarding one or more specifications of the output pulse, and is configured to adjust one or more settings of each Marx generator based on the received specifications.

8. The device of claim 1, wherein the common interface is configured to detect an overcurrent condition of each Marx generator of the plurality of Marx generators.

9. The device of claim 1, wherein the common interface is configured to detect one or more electrical arcs occurring in each Marx generator of the plurality of Marx generators.

10. The device of claim 1 further comprising a plurality of droop compensation units, wherein each droop compensation unit is associated with one of the plurality of Marx generators, and wherein each droop compensation unit is configured to maintain a flatness of the output pulse.

11. The device of claim 1, wherein the plurality of parallel Marx generators are isolated electrically and coupled magnetically on a primary winding of the transformer.

12. The device of claim 1, wherein magnetic signals generated by the plurality of Marx generators on a primary winding of the transformer are summed and transformed by a winding ratio into an output signal on a secondary winding of the transformer.

13. The device of claim 1, further comprising a plurality of droop compensation units each associated with a respective Marx generator of the plurality of Marx generators, wherein each of the plurality of droop compensation units obtains droop compensation through a configuration of diodes and capacitors in parallel and series to main Marx discharge stages.

14. A electronic device for generating a pulse, the device comprising:
 a plurality of Marx generators, wherein the plurality of Marx generators are connected in parallel;
 a common interface, wherein the common interface is configured to send and receive one or more control signals to and from each Marx generator of the plurality of Marx generators; and
 a transformer, wherein the transformer is connected to the plurality of Marx generators and is configured to receive a plurality of signals from the plurality of Marx generators and generate an output pulse based on the plurality of received signals, wherein the transformer comprises a first winding to receive a first output signal of the plurality of signals from a first Marx generator of the plurality of Marx generators connected in parallel and comprises a second winding to receive a second output signal from a second Marx generator of the plurality of Marx generators connected in parallel, and wherein the plurality of signals received from the plurality of Marx generators each has an output current greater than 500 amperes and an output voltage greater than 2000 volts.

* * * * *